(12) United States Patent  
Charbon et al.

(10) Patent No.: US 6,625,780 B1  
(45) Date of Patent: Sep. 23, 2003

(54) WATERMARKING BASED PROTECTION OF VIRTUAL COMPONENT BLOCKS

(75) Inventors: Edoardo Charbon, Berkeley, CA (US); Ilhami H. Torunoglu, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 09/514,695

(22) Filed: Feb. 28, 2000

(51) Int. Cl.$^7$ ............................................. G06F 17/50
(52) U.S. Cl. ................................ 716/1; 716/4; 716/5
(58) Field of Search .................................. 716/1, 4, 5

(56) References Cited

U.S. PATENT DOCUMENTS

| | | | | |
|---|---|---|---|---|
| 5,542,034 A | * | 7/1996 | Petler | 716/1 |
| 5,838,583 A | | 11/1998 | Varadarajan et al. | 364/491 |
| 6,074,428 A | * | 6/2000 | Petler | 716/15 |

OTHER PUBLICATIONS

Oliveira, "Robust techniques for watermarking sequential circuit designs", Jun. 1999, IEEE, pp. 837–842.*
Pena, "A new algorithm for the reduction of incompletely specified finite state machine", Nov. 1998. IEEE, pp. 482–489.*
Avedillo, "A new method for the state reduction of incompletely specified finite sequential machines", Mar. 1990. IEEE, pp. 552–556.*
Kirovski, "Intellectual property protection by watermarking combinational logic synthesis solutions", Nov. 1998. IEEE, pp. 194–198.*
Naik, "Efficient computation of unique I/O sequences in FSM's", Aug. 1997. IEEE, pp. 585–599.*
Oikonomou, "Abstractions of finite–state machines and optimality with respect to immediately–detectable next-state faults", Jan. 1996. IEEE, pp. 151–160.*
Lach, "Robust FPGA intellectual property protection through multiple samll watermarks", Jun. 1999. IEEE, pp. 831–836.*
Kahng, "Watermarking techniques for intellectual property protection", Jun. 1998. IEEE, pp. 776–781.*
Lach, "Signature hiding techniques for FPGA intellectual property protection", Nov. 1998. IEEE, pp. 186–189.
Sentovich, "Sequential circuit design using synthesis and optimazation", Oct. 1992. IEEE, pp. 328–333.
Pfleeger, "state reduction of completely specified FSM's", 1973. IEEE, pp. 1099–1102.
Demir, Alper, et al., "Modeling and Simulation of the Interference due to Digital Switching in Mixed–Signal ICs," 1999 IEEE/ACM International Conference on Computer–Aided Design, Nov. 7–11, 1999, pp. 70–74.

(List continued on next page.)

*Primary Examiner*—John F. Niebling
*Assistant Examiner*—Stacy Whitmore
(74) *Attorney, Agent, or Firm*—Bingham McCutchen LLP

(57) ABSTRACT

A system and method for protecting circuit designs from unauthorized use involves techniques for watermarking by embedding a hidden, recognizable input/output signature or code into the circuit design. An internal sequential function, such as a finite state machine, within the circuit design is used to generate a predictable output sequence when a known input sequence is applied. The free input configurations in the internal sequential function of the circuit design are identified and modified to generate the desired output sequence when the known input sequence is applied. A path among the free input configurations is selected, with output values in the desired output sequence being assigned the various state transitions. If there are not enough free input configurations to meet specified watermarking robustness criteria, then additional free input configurations may be added by, for example, adding one or more inputs, outputs or states to the finite state machine. Various techniques for arriving at an optimal path so as to minimize overhead caused by the addition of the watermark are also disclosed.

40 Claims, 11 Drawing Sheets

OTHER PUBLICATIONS

Charbon, E., "Hierarchical Watermarking in IC Design," *Proc. IEEE Custom Integrated Circuits Conference*, May 1998, pp. 295–298.

Charbon, E., et al., "Watermarking Layout Topologies," *IEEE Asia–South Pacific Design Automation Conference*, May 1999, pp. 213–216.

Torunoglu, I., et al, "Watermarking–Based Copyright Protection of Sequential Functions."

Swanson, et al., *"Transparent Robust Image Watermarking"*, in *Proc, IEEE International Conference in Image Processing*, vol. 3, pp. 211–214, Sep. 1996.

Boney, et al., *"Digital Watermarks for Audio Signals"*, in *Proc. IEEE International Conference on Multimedia Computing and Systems*, pp. 473–480, Jun. 1996.

Lach, et al., *"FPGA Fingerprinting Techniques for Protecting Intellectual Property"*. In *Proc. IEEE Custom Integrated Circuit Conference*, pp. 299–302, May 1998.

Kahng, et al., *"Robust IP Watermarking Methodologies for Physical Design"* in *Proc. IEEE/ACM Design Automation Conference*. pp. 782–787, Jun. 1998.

Villa, et al., *"Synthesis of Finite State Machines: Logic Optimization," Chapter 5 –Symbolic Minimization*; Kluwer Academic Publ., Boston, MA 1997.

De. Micheli, *"Synthesis and Optimization of Digital Circuits"*. Chapter 9 –*Sequential Logic Optimization*–McGraw–Hill, 1994.

* cited by examiner

WATERMARKING BASED PROTECTION OF VIRTUAL COMPONENT BLOCKS

BACKGROUND OF THE INVENTION

1. Field of the Invention

The field of the present invention relates to techniques for protecting virtual circuit blocks and other electrical circuit designs from unauthorized use, transfer and/or sale by providing a recognizable watermark.

2. Background

Electronic systems are built in large part using stand-alone, individually packaged chips, which are assembled on printed circuit boards (PCBs) and connected together to obtain the desired functionality. The computer industry is currently shifting towards a new design paradigm based on the use of pre-existing circuit blocks. Under this paradigm, systems are assembled by integrating several electronic circuit subsystems or circuit blocks on the same silicon substrate, which takes the place of the printed circuit board. Advances in silicon technology are responsible for allowing larger and more complex designs to be formed on a single chip, and hence enabling entire systems to be placed on the same silicon substrate.

At the same time as silicon technology has been improving, market demands continue to push designers to develop chip designs more rapidly and efficiently. A recent trend to increase design speed and efficiency involves the re-use or recycling of electronic circuit blocks or subsystems, which are alternatively referred to as "cores", "virtual component blocks" or "IPs" (an acronym for "Intellectual Properties," which denotes the proprietary nature of these pre-packaged circuit blocks).

Once the design for a virtual component block has been tested and verified, it can be re-used in other applications which may be completely distinct from the application which led to its original creation. For example, a subsystem for a cellular phone ASIC may contain a micro-controller as well as a digital signal processor and other components. After the design for the cellular phone subsystem has been tested and verified, it could be re-used (as a virtual component block) in, for example, an automotive application. Design reuse of virtual component blocks allows a designer to Complete a design much faster than building the entire design from scratch, and avoids the need for debugging, testing and verification of the subsystems embodied in the virtual component block.

Since virtual component blocks, or IPs, physically exist on magnetic storage devices, they are relatively easy to copy, forge and re-design. Moreover, the increased efficiency brought about by the existence of virtual component blocks also provides an incentive for unauthorized use, re-use transfer or sale of these items. Providers of virtual components are therefore in need of an effective method of protecting their designs, so that they are not deprived of the benefits of the resources spent in design development or procurement of virtual component blocks.

Traditionally, protection of circuit designs has largely been through legal means such as non-disclosure agreements, patents or copyrights. By themselves, however, such legal means are of limited use, because detection of illegal copying, forging, transfer or re-use of proprietary virtual component blocks is difficult. It can be challenging to determine whether a virtual component block was illegally acquired by a particular user. The user, for example, may make superficial changes to the virtual component block to disguise its illicit source. Furthermore, the costs involved in preventing or containing unauthorized copying, re-use or transfer of virtual- component blocks, and in discovering whether particular virtual component blocks have been illegally acquired, can be excessive.

One conventional method which has been used in an attempt to protect proprietary virtual circuit blocks is a technique known as "tagging." Tagging involves the creation of an electronic document containing information about the ownership of the virtual component block. The electronic document, in text form, is typically embedded into the virtual component block at the mask level. Usually, the circuit mask is implemented in a standard language such as GDSII which allows for the convenient insertion of text. However, because text at the mask level may be easily removed, tagging is not especially effective.

Tagging also has the disadvantage that it does not generally protect circuit designs (such as virtual component blocks) at higher levels of abstraction than the mask level. Tagging does not provide for traceability of a mask level file to a higher-level instantiation that may have been illegally obtained in violation of the owner's proprietary rights.

Given the anticipated growth in commerce related to virtual component blocks, the electronic circuit design industry is in dire need of a method of protecting their proprietary virtual circuit designs that is more effective and affordable than existing schemes.

Recently, the concept of watermarking has been applied to digital audio-visual files. Watermarking is a technique that has traditionally been used with banknotes and other paper documents to discourage counterfeiting. The technique generally consists of embedding semi-transparent symbols on paper so that the original document can be distinguished from a copy.

One method which attempts to apply watermarking concepts in the context of virtual circuit blocks is described in "Watermarking Layout Topologies" appearing in *Proc. IEEE Asia-South Pacific Design Automation Conference* (January 1999), pp. 213–216, by Eduardo Charbon and Ilhami Torunoglu, which article is hereby incorporated by reference as if set forth fully herein. In that paper, a watermarking technique is described which addresses the particular problem of protecting virtual circuit blocks at the lowest abstraction level, i.e., the physical layout implementation. However, a shortcoming of this watermarking technique is that unauthorized deletion of the watermark is still possible at abstraction levels higher than the physical implementation, such as in netlists and register transfer logic (RTL) representations.

Another technique which attempts to apply watermarking concepts in the context of virtual circuit blocks is described in "Hierarchical Watermarking in IC Design," appearing in *Proc. IEEE Custom Integrated Circuits Conference* (May 1998), pp. 295–298, by Edoardo Charbon. However, the watermarking technique described therein also suffers from the possibility of unauthorized tampering and/or deletion.

There is a need for a more effective technique for protecting virtual component blocks, and other similar types of circuit design files, from unauthorized copying, re-use, transfer or sale. There is further a need for such a technique that is cost-effective yet relatively simple to implement, and that is resistant to tampering by the user.

SUMMARY OF THE INVENTION

The invention in one aspect provides systems and methods for protecting electronic circuit blocks and other virtual component blocks from unauthorized use, transfer and/or sale by watermarking and, more particularly, by embedding hidden, recognizable codes into a virtual component block.

In one embodiment, a system and/or method for watermarking a circuit design are provided wherein the circuit design comprises at least one internal sequential function, which may be embodied, for example, as a finite state machine. According to a preferred embodiment, free input configurations in the internal sequential function of the circuit design are identified and modified to generate a predictable output sequence when a specified input sequence is applied, by using said free input configurations. The specified input sequence and predictable output sequence collectively comprise an input/output signature (referred to herein as "I/O signature).

If there are not enough free input configurations to meet specified watermarking robustness criteria, then additional free input configurations may be added. Where the sequential function being modified is a finite state machine, free input configurations may be added by adding one or more inputs, outputs or states to the finite state machine.

Different embodiments are described herein for selecting an optimum path among state transitions so as to minimize overhead caused by inclusion of the input/output signature. A methodical search of a decision tree may be used to select the optimal path, or else Monte Carlo methods or branch-and-bound searching may be used.

Further embodiments, variations and enhancements are also described herein.

BRIEF DESCRIPTION OF THE DRAWINGS

The invention may be better understood by reference to the drawings, wherein.

DETAILED DESCRIPTION OF THE PREFERRED EMBODIMENTS

Figure 1:
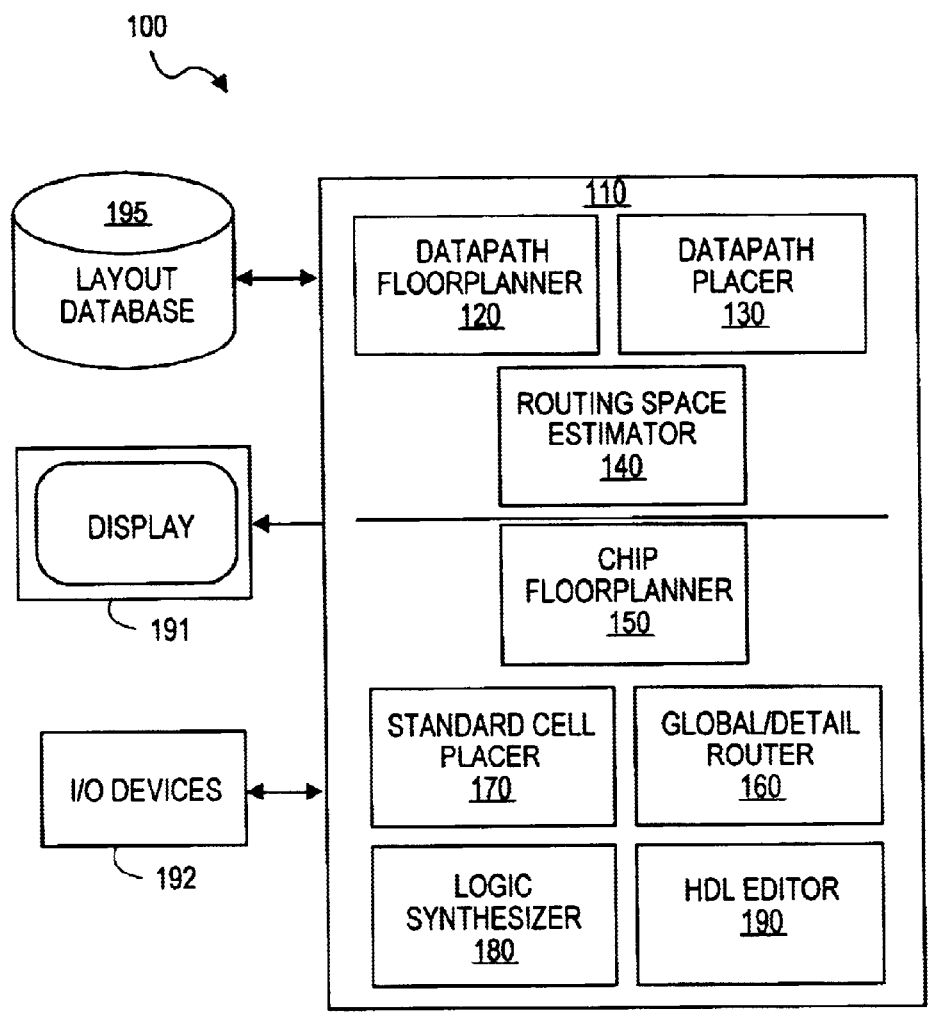
FIG. 1 is a diagram of a computer system that may be used in connection with various embodiments of the invention as described herein.

In one or more embodiments as described herein, a system and method for deterring the unauthorized use and sale of virtual component blocks, or IP's, is provided, wherein a unique digital signature or watermark is embedded into sequential function circuitry contained within the virtual component design.

Virtual component blocks are typically generated as part of a design process which can involve a number of steps, depending upon the level of abstraction desired for the particular circuit design. Chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

Two of the primary types of components used in integrated of circuits are datapaths and control logic. Control logic, typically random logic, is used to control the operations of datapaths. Datapath areas of the circuit perform functional operations, such as mathematical or other operations.

The various components of an integrated circuit are initially defined by their functional operations and relevant inputs and outputs. The designer may also provide basic organizational information about the placement of components in the circuit using floorplanning tools. During these design states, the designer generally structures the circuit using considerable hierarchical information, and has typically provided substantial regularity in the design.

From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity.

Further explanation of a particular chip design process, with emphasis on placement and routing of datapaths, is set forth, for example, in U.S. Pat. No. 5,838,583, hereby incorporated by reference as if set forth fully herein.

FIG. 1 is a diagram of a computer system that may be used in connection with various embodiments of the invention as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Computers, Inc. of Santa Clara, Calif., or any other suitable computer.

The computer 110 contains stored program code including, in one embodiment, a datapath floorplanner 120, a datapath placer 130 and a routing space estimator 140. The datapath flooplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space required for routing the datapath functions, given the placement of such functions by the datapath placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™, Synergy™, and Verilog®, respectively.

The computer 110 is preferably coupled to a mass storage device (e.g., magnetic disk or cartridge storage) providing a layout database 195 with which the foregoing system components interface. The layout database 195 may be implemented using the EDIF-database standard. The computer 110 may also comprise or be connected to mass storage containing one or more component libraries (not shown) specifying features of electrical components available for use in circuit designs.

Figure 2:
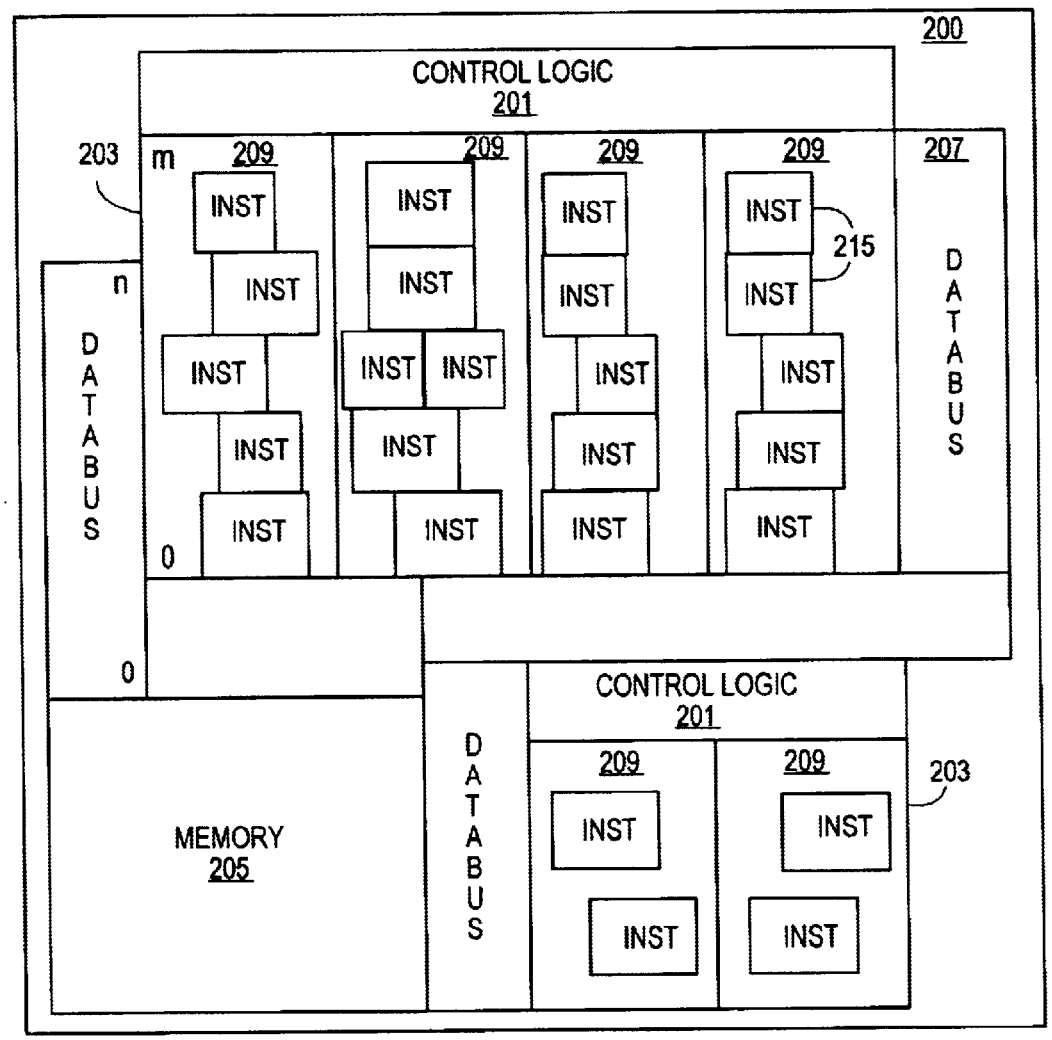
FIG. 2 is a diagram of a simplified integrated circuit as may be represented in the form of a virtual component block.

Referring now to FIG. 2, there is shown a schematic illustration of a simplified integrated circuit 200 that may be represented by virtual circuit design data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control regions 201, datapath regions 203, and memory 205. The various control regions 201, datapath regions 203 and memory 205 are interconnected with databuses 207 generally spanning multiple bits. Each datapath region 203 may comprise a plurality of datapath functions 209. A datapath function 209 may utilize some or all of the bits available from the databus 207. A datapath function 309 may comprise a plurality of cell instances 215 which enable some form of signal or logic transformation of the data passed by the databus 207. The cell instance 215 within a datapath function 209 generally operates on the data carried on the datapath function 209.

As represented in the schema of the layout database 195, the integrated circuit 200 is comprised of a plurality of instances and a plurality of nets. A net interconnects a number of instances, by associating pins on each of the instances.

Figure 3:
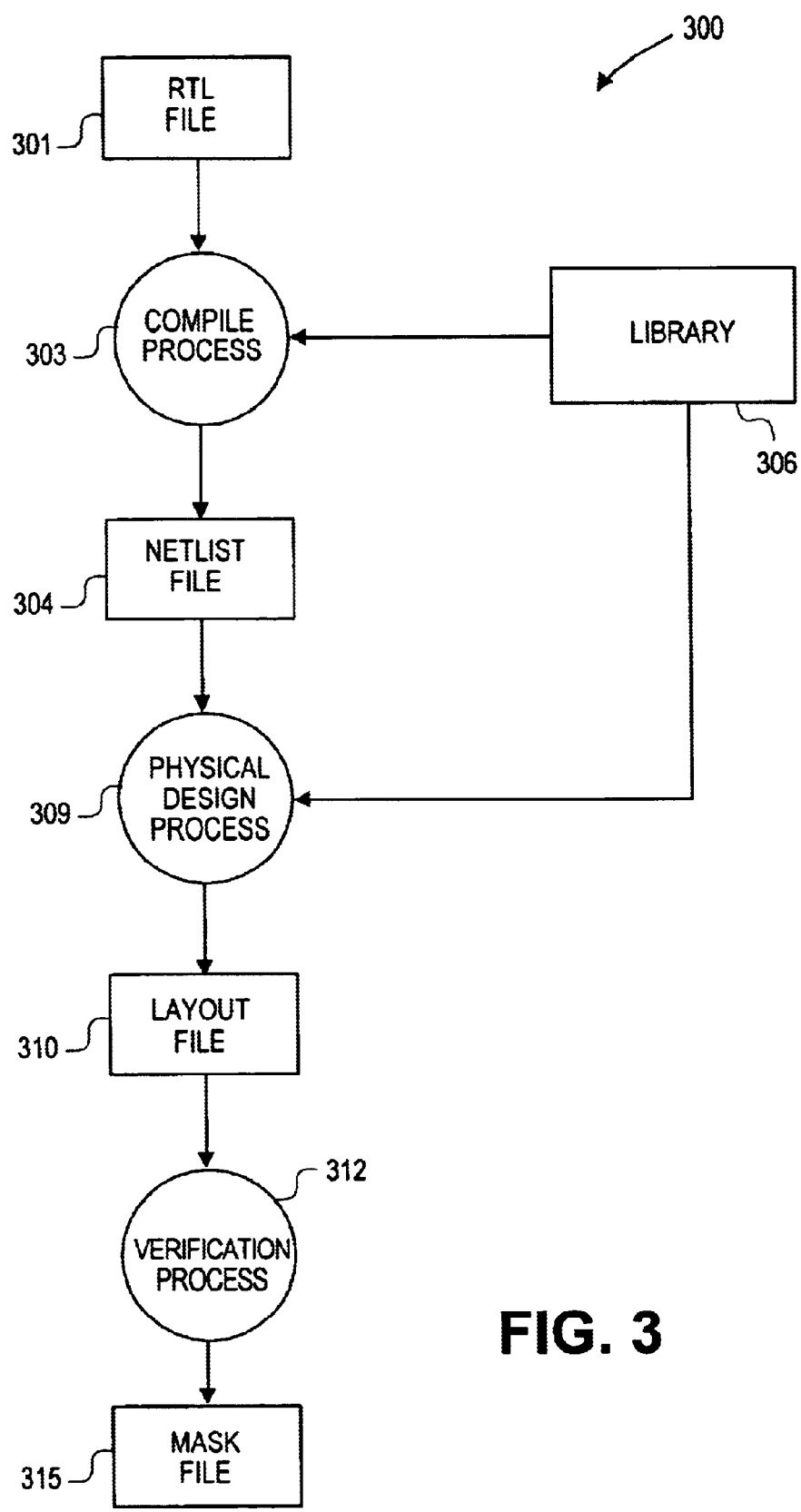
FIG. 3 is a diagram of a general process flow for a circuit design, illustrating various levels of circuit abstraction.

FIG. 3 is a diagram of a general process flow for a circuit design, illustrating some of the various levels of circuit abstraction as described above. As illustrated in FIG. 3, a register transfer logic (RTL) file 301 in the form of an HDL file or other high level functional description undergoes a compile process 303, which typically includes some form of logic synthesis, and converts the functional description of the circuit into a specific circuit implementation which may be stored in the form of a netlist file 304. As part of the compile process 303, a component library 306 is generally referenced, which stores information concerning what types of design components are available, and the characteristics of those design components which are needed in order to determine their functional connectivity. At this process stage, some attempt may be made at circuit optimization in order to minimize the number of components used in the circuit design. The netlist file 304, as previously noted, generally identifies the specific logic cell instances from a target standard cell library, and describes the specific cell-to-cell connectivity.

By application of a physical design process 309 shown in FIG. 3, the logic cells of the netlist file 304 are then placed and routed, resulting in a layout file 310. The physical design process 309 may include area minimization efforts. The component library 306 is utilized in this process stage in order to obtain information concerning the sizes of gates and other components that may be present in the netlist file 304.

From the layout file 310, a verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

At the different design stages depicted in FIG. 3, the circuit design exists in different levels of abstraction. At the highest level of abstraction, the circuit design may exist as an RTL file 301, and later may be transformed by various process stages into a netlist file 304, layout file 310 and/or a mask file 315. Each of the foregoing files may be considered a virtual component block, as used herein, for which watermarking protection according to the present invention may be applied.

The embodiments of the invention as described herein are applicable to a wide variety of virtual component blocks, whether they relate to system level macros, megacells, or embedded software "cores" used in system chip design. Virtual component blocks can generally be categorized according to their "firmness" as far as level of abstraction in the design stage. Virtual component blocks may, for example, be classified in one three firmness categories: "soft," "firm," and "hard." The category of firmness characterizes the development stage, on the spectrum from functional specifications to a particular fabrication process, as described in more detail below.

"Soft" virtual component blocks are typically delivered in the form of sythesizable hardware description language (such as, for example, VHDL or Verilog™). Soft virtual components are highly flexible and may be generic and configurable. "Firm" virtual component blocks are largely structural-type models optimized for a generic technology. The level of detail of a firm virtual component block may range, for example, from a circuit design in which region placement of RTL sub-blocks is specified, via relatively placed data paths, to circuit design having a fully placed netlist. Firm virtual component blocks generally do not include routing and are portable across target technologies. "Hard" virtual components are mapped to a specific technology, and are generally optimized for power, size and performance in the target technology. Examples of hard virtual components may include a custom physical layout, or a netlist which is fully placed, routed and optimized for a given technology. Hard virtual component blocks are process or vendor specific, and usually expressed in a standard design language such as GDSII. A user generally has a high level behavioral model, a test list and full physical/timing models along with the GDSII file in order to effectively use a hard virtual component block.

From the standpoint of protection of proprietary designs, virtual component blocks above the mask level are at the highest risk of unauthorized use, copying or transfer because they can be used to generate lower-level designs that are difficult to trace to the original unauthorized virtual component block.

Different types of virtual component blocks may appear in more than category of firmness. For example, a hardware virtual component block such as a megacell could be captured either in the form of a functional description (in a standard functional language, such as HDL (Hardware Description Language)), a physical abstraction (in a standard physical abstraction language, such as GDSII), or layout data. An embedded software virtual component block can, for example, be stored in the form of either source code or executable code. This flexibility helps the user re-use virtual component blocks in the desired abstraction level.

According to various embodiments as disclosed herein, systems and methods are provided for synthesizing watermarks in a class of circuit designs which implement regular sequential functions operating on finite input/output sequences. A watermark that is incorporated into a virtual component block is preferably transparent, in the sense the it should not interfere with the design functionality. Furthermore, it is preferably robust, in the sense that it is hard to remove or forge, and also is preferably detectable, in the sense that it should be easy to extract from the design.

In one or more preferred embodiments, the internal sequential functions of a circuit design are modified to generate a predictable output when a specified input is applied. Sequential circuits include a wide variety of digital circuit designs, typically characterized by synchronous transition among a number of different available states. Examples include standalone or embedded processors. In one aspect, a watermark as provided according to systems and methods disclosed herein comprises a pair of input/output sequences of symbols which cannot occur during normal operation of the circuit. The watermarking input/output sequences are hidden among the "legal" input/output sequences of the circuit, thus making it extremely time consuming to track and remove them. Moreover, removal of the watermark by an aggressor risks accidental modification of the intended function of the circuit.

In various embodiments as disclosed herein, regular sequential functions operating on finite input/output sets, of the type useful to synthesis of watermarks according to certain aspects of the present invention, may be specified by a finite state machine (FSM). A finite state machine may generally be viewed as a discrete dynamical system that translates sequences of input vectors into sequences of output vectors. A finite state machine is typically represented by a state transition graph (STG) or state transition table (STT). Finite state machines are well known in the field of digital circuit design.

Figure 4:
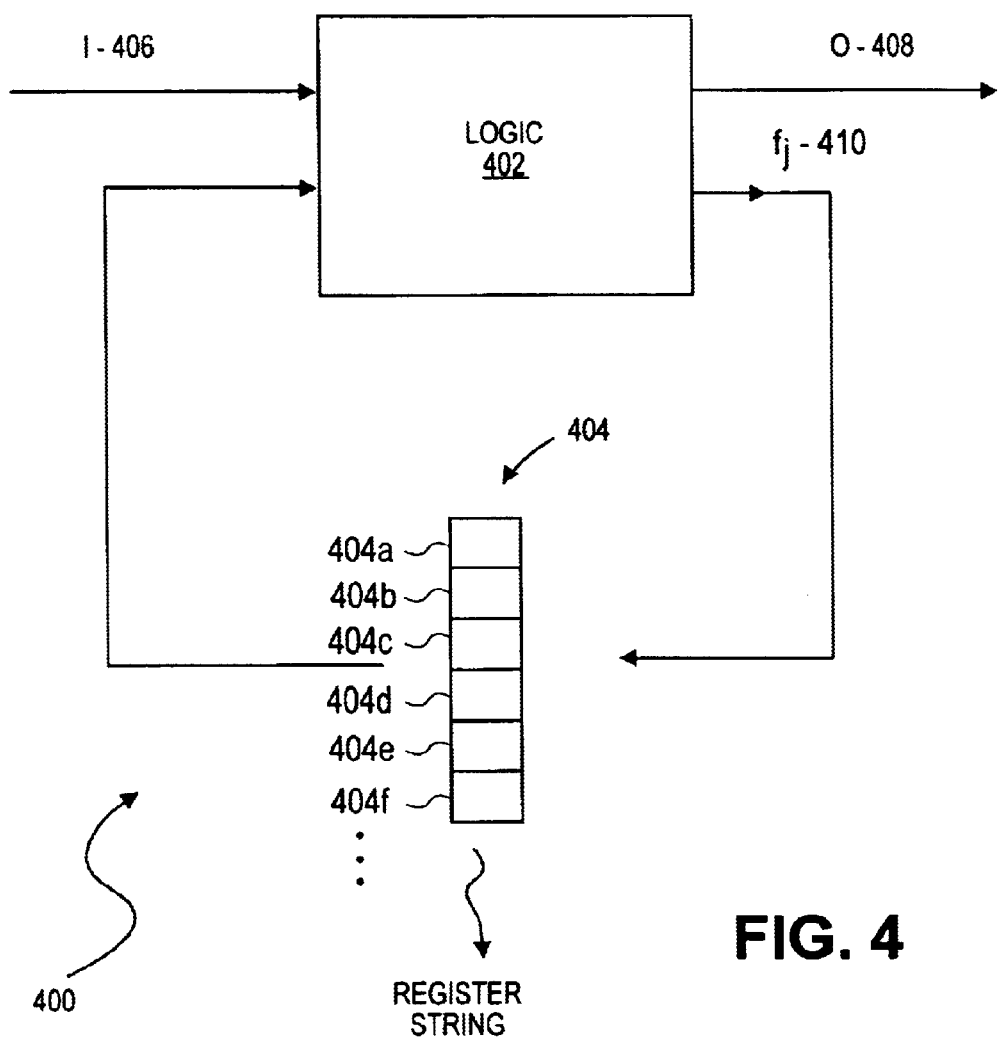
FIG. 4 is a diagram of a generic finite state machine.

FIG. 4 is a schematic representation of a generic finite state machine useful for illustrating some of the concepts described herein. As illustrated in FIG. 4, a finite state machine 400 receives a set of inputs 406 and generates a set of outputs 408. A logic network 402 operates upon the set of inputs 406 and, based thereon, generates the next logic "state" of the finite state machine 400. The universe of potential logic states for the finite state machine 400 may be represented by the different, states (i.e., the contents) of a memory component, typically represented as a collection of state registers 404 (individually designated in FIG. 4 as state registers 404a, 404b, 404c, etc.). The state registers 404 maintain the current logic state of the finite state machine 400 at any given time. Based on the set of inputs 406, and application thereof to the logic network 402, the logic state of the finite state machine 400 (and hence the contents of the state registers 404) may change. The logic network 402 outputs a feedback string 410 which is fed back to the state registers 404, causing them to change at the next loading cycle (typically a clock signal). The resulting register settings determine the state in which the finite state machine will operate on the next input string. The set of outputs 408 is determined not only by the set of inputs 406, as operated upon by the logic network 402, but also by the current logic state, as held by the state registers 404 and operated upon by the logic network 402.

The number of individual state registers 404a, 404b, 404c . . . determines the number of states available in the finite state machine 400. For example, with three individual state registers, there would be a total of $2^3$=8 possible logic states, and with four individual state registers, there would be a total of $2^4$=16 possible logic states, and so on. Not all of the available logic states need to be used in the design of a finite state machine. Optimally, a finite state machine contains the minimum number of individual state registers to completely specify all of the required logic states for the particular design.

In a preferred embodiment, watermarking functionality is provided at one or more of the design stages illustrated in FIG. 3. Watermarking may be achieved, in certain embodiments described herein, by identifying unused states or output sequences in a user-specified finite state machine that is part of a virtual circuit design, or else by augmenting a user-specified finite state machine to obtain the number of unused states and/or output sequences necessary to achieve a watermark of sufficient size and complexity to suit the needs of the owner of the circuit design.

To implement watermarking as a protection device, the watermark is preferably synthesized and implanted in the machine, and at some later point the watermark must be detected. Detection of the watermark, in one embodiment, entails applying input sequences to the machine and observing the resulting output sequences. If the watermark has been tampered or modified, which would indicate that the copyright has been infringed, the watermark will be mostly intact, hence the input sequence will (within the specified probability constraints) result in the expected output sequence, thus allowing detection. Preferred methodologies are provided herein for synthesizing and detecting watermarks in circuit designs having deterministic finite state machines which implement regular sequential functions operating on finite I/O sequences.

According to various embodiments disclosed herein, synthesis of a watermark generally consists of determining the desired size of the watermark, and choosing the specific I/O signature that will minimize overhead produced by a watermark of the chosen size. Generally, the larger the watermark, the more robust it will be. In other words, the probability of an aggressor being able to delete the watermark decreases as the size of the watermark increases. On the other, hand, as the size of the watermark grows, so does the amount of implementation overhead. The size of the watermark may be chosen arbitrarily, or, alternatively, it may be determined based on the desired robustness of the watermark.

Algorithms that allow the user to determine the necessary size of a watermark to satisfy designated robustness specifications are described below. An algorithm used to determine the necessary minimum size of the watermark is described hereinbelow, and uses the following user-specified constraints: (1) $P_u$, the probability of an unintended watermark being present, which represents the odds that a design carries an unintended watermark in part or whole (in other words, the probability of a false alarm during the detection phase); and (2) $P_m$, the probability that a watermark will escape detection. When the user has specified the foregoing constraints on the watermark, the method set forth herein enables the user to choose the specific I/O signature that satisfies the robustness constraints, $P_u$ and $P_m$ while minimizing overhead.

Figure 5:
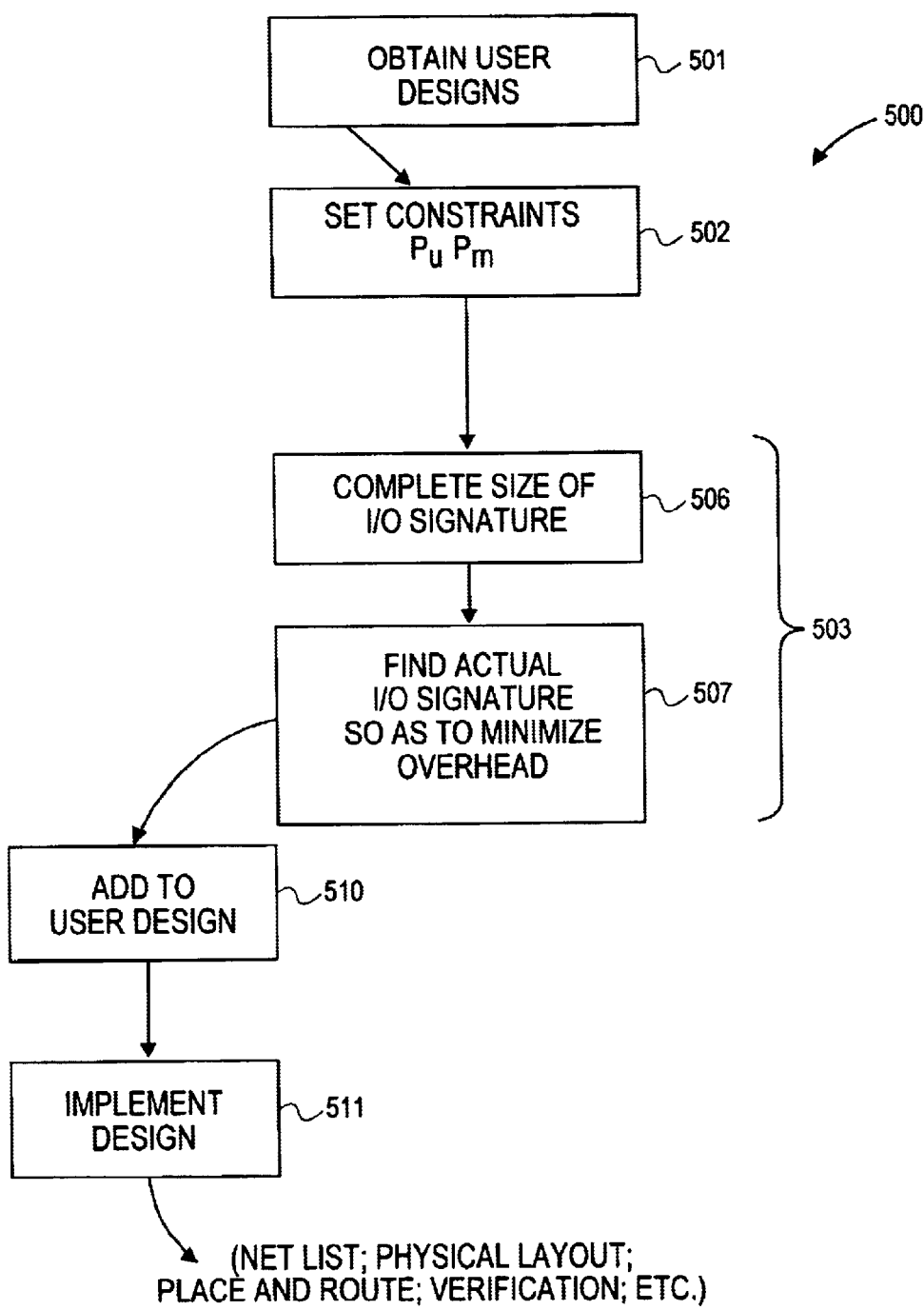
FIG. 5 is a process flow diagram illustrating various steps in a watermarking process in accordance with an embodiment as described herein.

FIG. 5 is a process flow diagram illustrating various steps in a watermarking process 500 in accordance with an embodiment as described herein. As illustrated in FIG. 5, the watermarking process 500 starts by receipt of user designs as set forth in step 501. The user designs may comprise one or more circuit designs with no particular restriction on the level of abstraction. In a next step 502, certain constraints (such as probability values $P_u$ and $P_m$) are set on the watermarking process which govern the robustness and detectability of the embedded watermark. In a next step 506, the size of the I/O signature for the finite state machine is determined based upon the constraints specified in step 502. Techniques for making this determination are described in more detail below. In a following step 507, a particular I/O signature is selected, preferably so as to minimize overhead relating to the circuit design. Techniques for making this selection are also described in more detail below.

Once the actual I/O signature is determined in step 507, then, in a next step 508, the circuitry and logic necessary to include that I/O signature is added to the user design. In a following step 511, the design is implemented, and the various files as described in relation to FIG. 2 may be generated.

Watermarking may be implemented either actively or passively. Active watermarking consists of integrating the watermark as a part of the design process, thus allowing the creation of an arbitrarily large number of unique watermarks. Passive watermarking is aimed at adding the watermark to a design making use of existing structures, thus requiring no redesign but allowing limited tracking flexibility. Both active and passive watermarking may be carried out according to the steps illustrated in FIG. 5.

Figure 6:
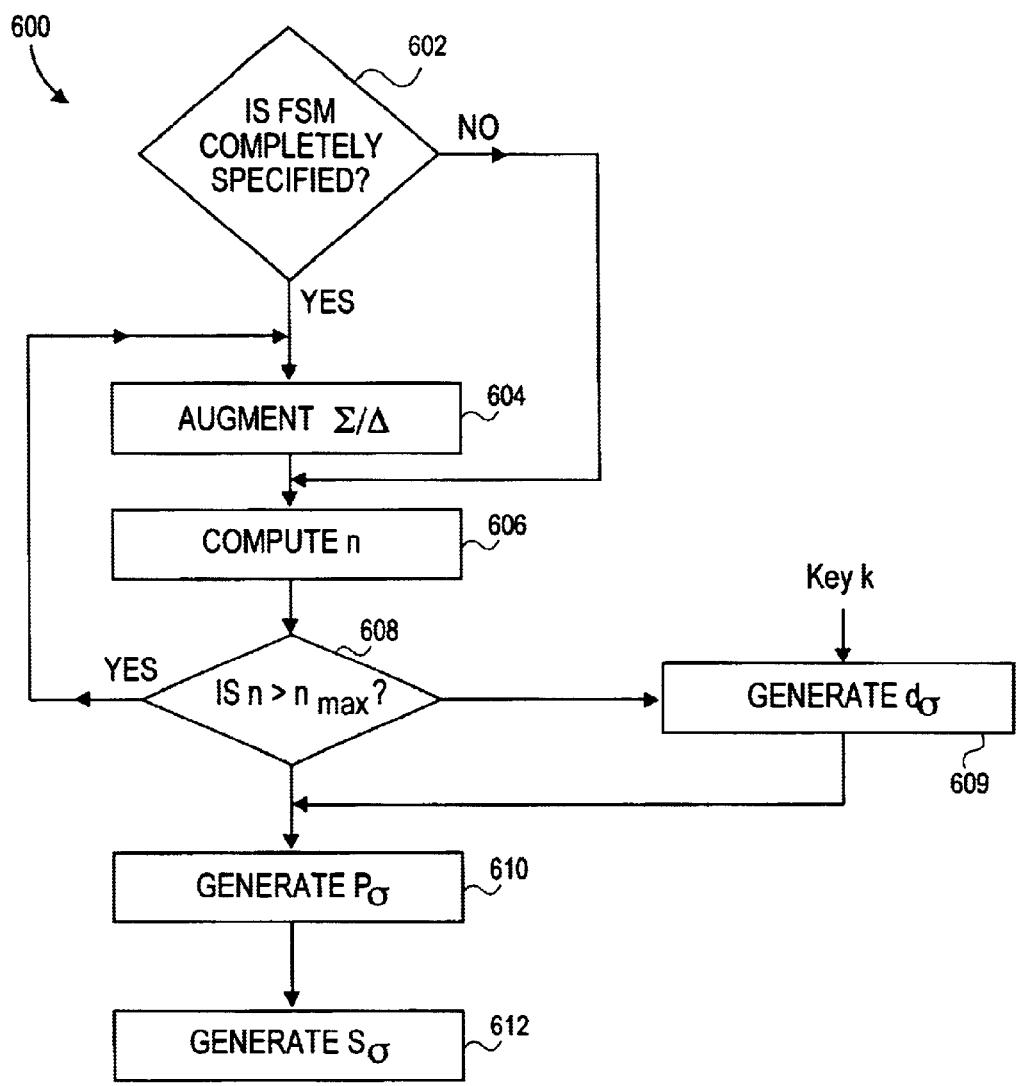
FIG. 6 is a process flow diagram illustrating steps involved in an active watermarking process according to a preferred embodiment.

FIG. 6 is a process flow diagram illustrating steps in an active watermarking process 600 in accordance with a preferred embodiment as disclosed herein. The active watermarking process 600 depicted in FIG. 6 generally corresponds to steps 506 and 507 illustrated in FIG. 5. However, steps 506 and 507 shown in FIG. 5 may be implemented in other ways as well.

In a first step 602 of the active watermarking process 600 set forth in FIG. 6, a determination is made as to what type of finite state machine has been specified by the user. For the purposes of step 602, finite state machines can be one of two types: either a completely specified finite state machine (CSFSM), or else an incompletely specified finite state machine (ISFSM). In a completely specified finite state machine, every input sequence results in a unique output sequence. In an incompletely specified finite state machine, there are some transition relations with unspecified destination states and/or unspecified outputs. In other words, an incompletely specified finite state machine has a set of input sequences for which either no output is specified or for which the resulting state is not specified. Input sequences for which the transition relation does not have a specified destination and/or output may be referred to as free input sequences. Output sequences that can be produced only by unspecified input sequences may be referred to as free output sequences.

To facilitate the explanation of the steps illustrated in FIG. 6, some additional notation relating to finite state machines will now be described. A finite state machine may be described as a tuple $M=(\Sigma, \Delta, Q, q_o, \delta, \lambda)$, where $\Sigma$ represents the input alphabet of the finite state machine, $\Delta$ represents the output alphabet of the finite state machine, $Q$ is a finite set of states, $q_0 \in Q$ is the initial state, $\delta(q,a): Q \times \Sigma \rightarrow Q \cup \{\phi\}$ refers to the transition relation between states, and $\lambda(q,a): Q \times \Sigma \rightarrow Q \cup \{\epsilon\}$ refers to the output relation. In the foregoing expressions, $\phi$ is used to denote an unspecified next state, and $\epsilon$ is used to denote an unspecified output.

A finite state machine may be expressed by the mapping of all its input and output sequences, or I/O mapping. An I/O mapping may be defined as the sequence of input/output pairs $(a_1, b_1), (a_2, b_2), \ldots (a_k, b_k)) \in (\Sigma \times (\Delta \cup \{\epsilon\}))^k$ that specifies the output sequence of the finite state machine for a given input sequence. In the foregoing, a $\in \Sigma$ refers to an input sequence, and b $\in \Delta$ represents an output sequence.

The above notation is also useful for describing completely specified and incompletely specified finite state machines. Some further notation is useful in this regard. $\Sigma^*$ and $\Delta^*$ may be defined as the sets of all "strings" in the input alphabet $\Sigma$ of the finite state machine and output alphabet $\Delta$ of the finite state machine, respectively. Within the sets of all input strings $\Sigma^*$ and $\Delta^*$ may be defined an arbitrary input sequence $s=(a_1, \ldots, a_k) \in \Sigma^*$ and an arbitrary output sequence $d=(b_1, \ldots, b_k) \in \Delta^*$. Further, an output symbol $\lambda(q, s)$ of the finite state machine and a state $\delta(q, s)$ of the finite state machine may be represented thusly when input sequence s has been applied in state q. From a mathematical standpoint, input sequence s may be said to be "contained in" finite state machine M if (and only if) a state reached by applying input sequence s to the initial state $q_0$ is also in finite state machine M—that is, if (and only if) $\delta(q_o, s) \in Q$.

Following through with the above notation, a completely specified finite state machine (CSFSM) may be defined as a finite state machine containing every element of the set of input strings $\Sigma^*$, that is, every input sequence in $\Sigma^*$ results in a unique output sequence in the set of output strings $\Delta$. An incompletely specified finite state machine (ISFSM), on the other hand, may be defined as a finite state machine in which there exist some transition relations with an unspecified destination and/or output, that is, there exists a set of input sequences or strings for which no output is specified. The set of such input sequences or strings for which no destination or output is specified (also referred to as "free configurations") may be denoted $I_u$. The set of output sequences which can be produced only by unspecified input sequences may be denoted $O_u$.

To synthesize a watermark, it is preferred that the user design contain an incompletely specified finite state machine (ISFSM). If the user design does not contain such, then, according to the techniques described herein, a completely specified finite state machine (CSFSM) may be transformed into an incompletely specified finite state machine (ISFSM), by the addition of new states, inputs and/or outputs. Also, if the incompletely specified finite state machine is not large enough to allow watermark synthesis according to the specified constraints, then the finite state machine may be augmented to include additional states, inputs and/or outputs, and thereby provide enough resources to synthesize the desired watermark.

First considering the case of an incompletely specified finite state machine, let the tuple $M'=(\Sigma', \Delta', Q', q_0', \delta', \lambda')$ be an incompletely specified finite state machine contained in a user design, and $P_M$, be the set of all possible completely specified implementations of M'. Thus, for each implementation $p \in P_{M'}$, every element of the input sequence set $I_U$ and output sequence set $O_u$ is eventually associated to an element of $\Sigma^*$ and $\Delta^*$, respectively. An arbitrary sequence $s_\sigma$ may be selected from the set of input sequences $I_u$ for which no output is specified, and it will have a corresponding output sequence $d_o$ which is a member of the set of output sequences $\Delta^*$. The tuple $\sigma=(s_\sigma, d_o)$ may be referred to as an "input/output signature" (or "I/O signature" or "watermark") for the finite state machine.

In one aspect, with respect to an active watermarking regime, the task of synthesizing a watermark for an incompletely specified finite state machine M' may be viewed, from a practical standpoint, as equivalent to that of minimizing the size of a modified finite state machine M" whose specified mapping has been augmented by I/O signature $\sigma$. This task can be partitioned into two sub-tasks. The first is sub-task is computing the size of I/O signature $\sigma$ so as to satisfy the constraints on robustness—that is, satisfying constraints on $P_u$ (the probability of an unintended watermark or false alarm being present) and $P_m$ (the probability that a watermark will escape detection). The second sub-task is that of finding or selecting an I/O signature so as to minimize the overhead of the "modified" finite state machine M". Preferably, the I/O signature of finite state machine M" is generated with some degree of randomness to ensure that, using the same algorithm, one cannot generate the identical code. The randomized algorithm may be controlled by a key k, as further described herein.

Generation of a suitable I/O signature (watermark) $\sigma$ may be accomplished in at least two different ways. According to a first technique, new transition relations in the finite state machine's state transition graph or table may be generated. According to a second technique, the set of input sequences $\Sigma$, output sequences $\Delta$, and/or states Q of the finite state machine are augmented.

When determining the desired size of the watermark, it is preferable that the maximum number of free input configurations available be determined. In a completely specified finite state machine, there are none. In an incompletely specified finite state machine, the maximum number of free input configurations is determined by minimizing the number of completely specified implementations of a machine.

To determine the maximum number of free input configurations, the notation $q' \in Q'$ may be used to denote a state in an incompletely specified finite state machine M', and the notation $q_o'$ may be used to denote the reset state of finite state machine M'. Further, the notation $I_u^{(q')}$ may be used to represent the set of all the input configurations in q' for which no next state is specified (i.e., free configurations). A set U' may then be defined as the set of all the states with incompletely specified transition relations, that is, $U'=\{q' \in Q'$ for each $|I_u^{(q')}|>0\}$, where $|I_u^{(q')}|$ denotes the size (i.e., number or degree) of the set $I_u^{(q')}$ of free input configurations in state q'. Thus, the maximum total number of free input configurations n, may be bounded as follows:

$$n \leq n_{max} = \sum_{q' \in Q'} |I_u^{(q')}|$$

That is, the largest possible number $n_{max}$ of free input configurations is the sum of the number of free input configurations for each state q' in the set Q' of states for the finite state machine M'. It may be observed that the size of an output sequence d generated using only free input configurations is also thus bounded by the maximum number $n_{max}$ of free input configurations.

To take a very simple example, assume that there are two inputs to a finite state machine. With two inputs, there are four (i.e., $2^{|\Sigma|}$, where $\Sigma=2$ inputs in this example) possible input sets: 00, 01, 10 and 11. For this example, further assume that only one of the four input sets is used (e.g., 10) in a given state $q_i'$, with the other three input sets (00, 01, 11) being unspecified. Then $|I_u^{(q_i')}|$ is equal to three; in other words, the number of free input configurations in state $q_i'$ is three. The sum of the free input configurations for all states in the set Q' is $n_{max}$.

Every state q' within the set U' of all states with incompletely specified transition relations should be reachable $|I_u^{(q')}|$ times, using each time one of the remaining free input configurations on the set $I_u^{(q')}$ of free input configurations for state q'. This fact can be used to determine whether the incompletely specified finite state machine is of a size necessary to meet the constraints on watermark robustness.

First, it is desirable to select the minimum size $n_{min}$ of the I/O signature or watermark. The minimum size $n_{min}$ of the I/O signature or watermark may be determined either arbitrarily, or else by the value assigned to the probability $P_u$ of an unintended watermark being present, based upon the desired robustness of the watermark. To arrive at the minimum number of free input configurations needed, it is convenient to define a sequence $\upsilon$ of visited states, with s being the input sequence that forces the sequence $\upsilon$ of visited states. Then, the resulting output sequence d, having one output symbol (single- or multi-valued) for each visited state, will be one of $[2^{|\Delta|}]^n$ possible implementations, where $|\Delta|$ represents the number of strings in the set of output strings $\Delta$ (i.e., the order or degree of $\Delta$). In turn, the odds of an identical sequence being produced by another finite state machine, or in other words, the probability $P_u$ of an unintended watermark, may be determined using the following equation:

$$P_u=1/([2^{|\Delta|}]^n-1)$$

To have the actual probability $P_u$ of an unintended watermark be less than a specified maximum probability $P_u'$ of an unintended watermark (i.e., setting $P_u \leq P_u'$), a minimum value $n_{min}$ for the number n of free input configurations needed for the watermark may be determined as:

$$n>n_{min}=[1/|\Delta|][\log_2|1+(1/P_u')|]$$

In some cases, it may not be possible to find a number n of free input configurations such that the criteria for watermark robustness are met ($P_u'$ and $P_m'$) while at the same time having $n_{min} \leq n_{max}$. In such a case (i.e., where $n_{min}>n_{max}$), either the criteria for watermark robustness may be relaxed, or else the maximum length $n_{max}$ of the watermark or I/O signature may be increased.

These foregoing techniques are expressed in the steps illustrated in FIG. 6. In step 602, as mentioned previously, a determination is made as to what type of finite state machine has been specified by the user. If the finite state machine is completely specified, then preferably, in step 604, either the input alphabet $\Sigma^*$, the output alphabet $\Delta^*$, and/or the number of states is augmented so that there are free input configurations and transition relations available for the watermark.

Once an incompletely specified finite state machine is achieved, then, in a next step 606, the range of free input configurations n (and, hence, the size of the I/O signature) is computed. In other words, the maximum number $n_{max}$ and minimum number $n_{min}$ of free input configurations needed for the watermark are determined, according to the equations and relationships described above. In a next step 608, the maximum number $n_{max}$ of free input configurations is compared against the minimum number $n_{min}$ of free input configurations, to ensure that $n_{min}<n_{max}$. It is possible, given the size of the finite state machine and the desired watermark characteristics, that the maximum number of free input configurations available is less than the number of free input configurations necessary to satisfy the constraints on watermark robustness, that is, to satisfy the specified probability $P_u'$ of an unintended watermark being detected, and the specified probability $P_m'$ of missing detection of the watermark. If such is the case (that is, if the $n_{min}>n_{max}$), then the size of the finite state machine is not large enough in terms of input/output alphabet, and the process returns to step 604 wherein, as with handling a completely specified finite state machine in the first instance, the input alphabet $\Sigma^*$ and/or the output alphabet $\Delta^*$ is augmented so that there are free input configurations and transition relations available for the watermark (i.e, $n_{max}$ is increased). Alternatively, new values for $P_u'$ and $P_m'$ may be selected to relax the constraints on watermark robustness.

Once a suitable number n of free input configurations for the watermark or I/O signature is determined that is appropriate for the size of the (incompletely specified) finite state machine, the actual watermark or I/O signature may be selected, preferably starting with the output sequence first. More specifically, as illustrated in FIG. 6 in step 609, an output sequence (i.e., the latter portion of the I/O signature) $d_o \in \Delta^*$ is selected, along with, in step 610, the states that can produce it. The wanted output $d_o$ may be generated by an n-long sequence of states in the set U' of all states with incompletely specified transition relations. The resulting output sequence $d_o$ may be viewed, in one aspect, as a path of states $p_o = (q_o', u_1', \ldots, u_{n-1}')$ covering a subset of the states in the set U' of all states with incompletely specified transition relations. It is not necessary, but it is preferred, that the reset state $q_o'$ be a member of the set U' of all states with incompletely specified transition relations. The generation of the path of states $p_o$ does not contribute to the probability $P_u$ of coincidence (i.e., unintended watermark detection), but it does at least partially determine the impact that state minimization will have on the final finite state machine.

The selection of the wanted output sequence $d_o$ may be accomplished using a key k which is formed by aggregating the outputs from the free or added states. The key k may be used to select the desired output sequence $d_o$ randomly among several minimal cost solutions.

The next step 612 in the synthesis of the watermark is to generate an associated input signature $s_o$ for the given output sequence $d_o$. Because the selection of the associated input signature $s_o$ affects the impact that state minimization will have on the final finite state machine, its generation is preferably completed in such a way as to minimize the overhead resulting from the implantation of the watermark. Generation of input signature $s_o$ for the watermark is carried out in part by selection of the path of states $p_o$. Every time a state u' is touched by the path $p_o$, the finite state machine loses one of its $|I_u^{(q')}|$ free input configurations. In designating the path $p_o$, it is not necessary, as noted, that the finite state machine's initial state $q_o'$ be a node on the path $p_o$. However, if it is not a node on the path $p_o$, then preferably a different first state is selected for the path $p_o$, and the associated input sequence $s_o$ is augmented so that the transition relation acting in the initial first state $q_o'$ leads to the selected first state. Once both the output sequence $d_o$ and input sequence $s_o$ have been derived, the I/O signature or watermark $\sigma = (s_o, d_o)$ is completed.

Selecting a path $p_o$ through the available states U' may be accomplished using any of a variety of suitable path-minimizing search algorithms, so as to minimize the overhead introduced by the watermark synthesis circuitry. As one example, an Euler path search may be used to minimize the number of visited states, thereby maximizing the number of remaining free configurations per state.

Figure 7A:
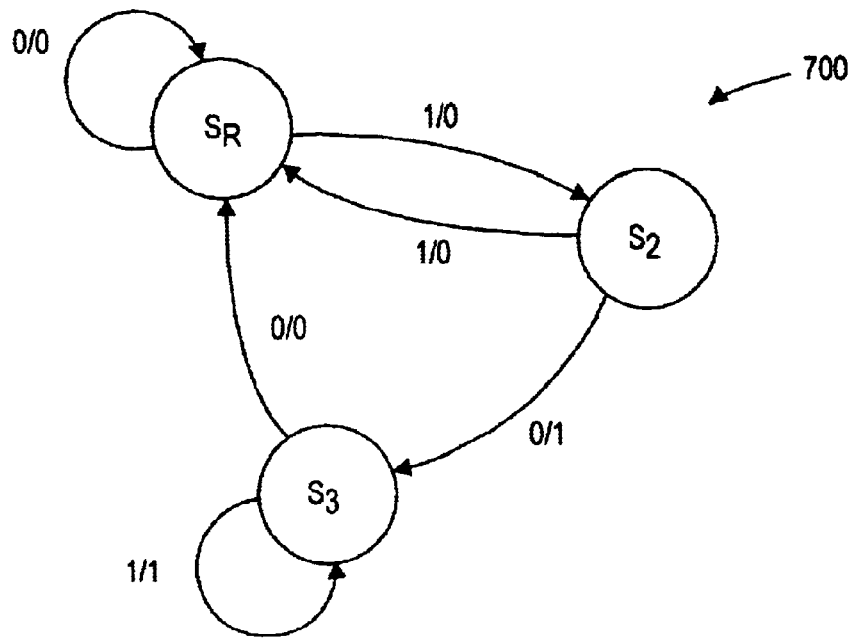
FIGS. 7A, 7B and 7C are state transition diagrams useful for illustrating an example of watermark generation according to techniques described herein.
Figure 7B:
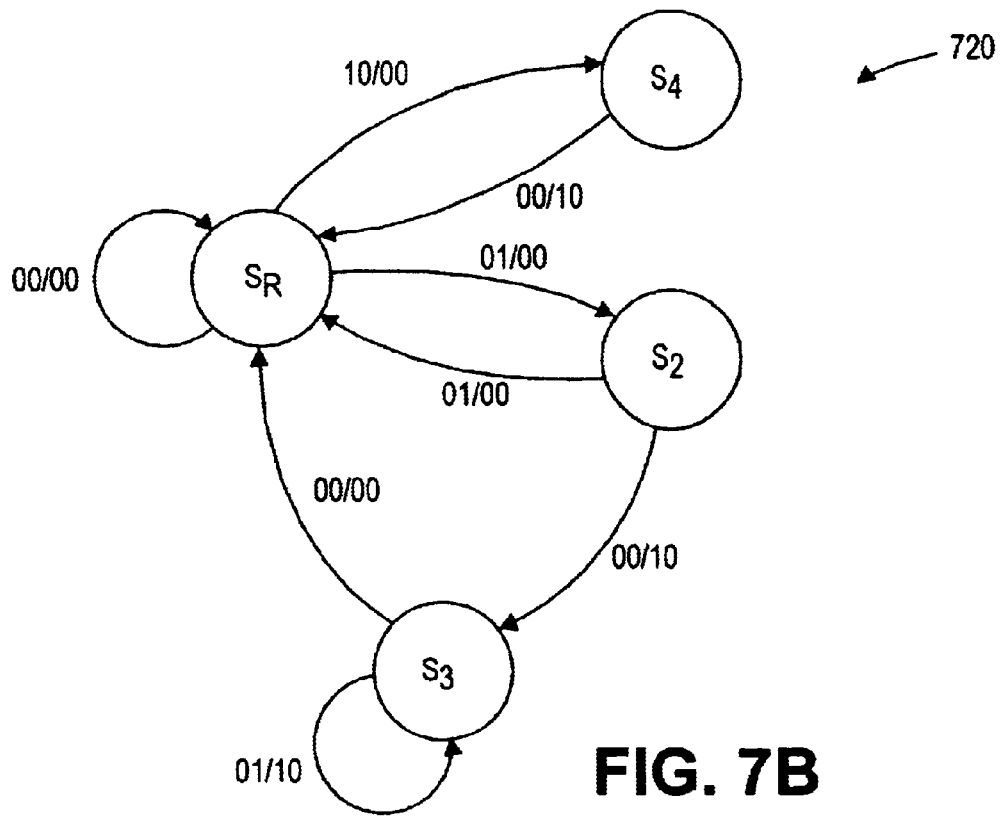
Figure 7C:
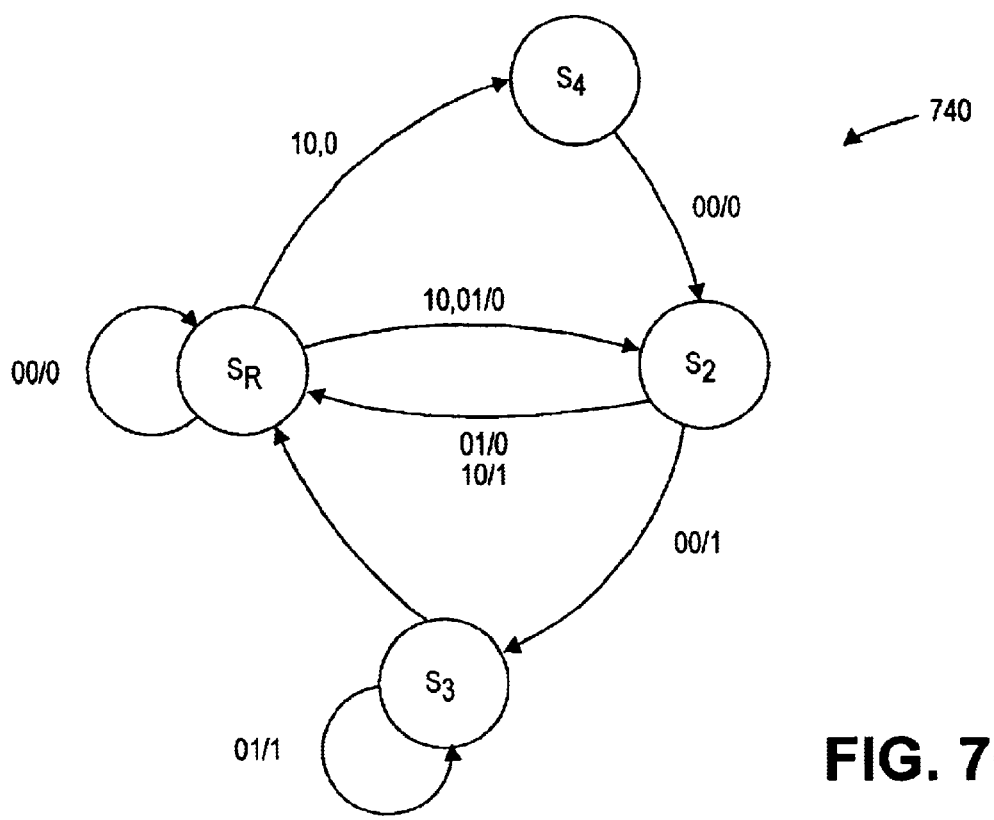

An example of generation of an I/O signature according to the process flow of FIGS. 5 and 6 is illustrated in FIGS. 7A through 7C. An example of a state machine graph for a finite state machine is depicted in FIG. 7A. The state transition graph 700 shown in FIG. 7A has three states: SR (the reset state), S2 and S3. It also has a single input and a single output. As can be seen, the finite state machine relating to the graph in FIG. 7A is completely specified, since each input combination is accounted for in each state (there being a single input). In order to generate an I/O signature, either new inputs, new outputs or new states need to be added.

FIG. 7B shows a modified state transition graph 720 in which a new state S4 has been added to the state transition graph 700 shown in FIG. 7A. New state S4 can only be reachable by adding a new input to the input alphabet $\Sigma^*$ of the finite state machine. In this example, a 0 has been added to each input and output of the existing state transitions in the original state transition graph, to arrive at the state transitions between states SR, S2 and S3 in FIG. 7B (although the new input could have been assigned any value arbitrarily, not simply 0). Assuming that generation of the I/O signature will start when the finite state machine is in state SR (but any state could be chosen), state transitions may then be selected to define the watermark. In this example, the desired output for the watermark is selected according to the watermark robustness criteria or otherwise as 4 bits, and the 4-bit output sequence for the watermark is selected arbitrarily or randomly as 0010.

Next, free input configurations need to be assigned in order to generate the desired output sequence. In this example, since a new input has been added to the input alphabet, there are two free input configurations (10 and 11) available in each state SR, S2 and S3, plus four free input configurations (00, 01, 10 and 11) in new state S4. The free input configuration 10 in state SR and free input configuration 00 in state S4 were selected in this simple example to generate the watermark. An output of 00 is assigned to the first state transition from SR to S4 upon input 10, and an output of 10 is assigned to the second state transition from S4 back to SR upon input 00. Thus, upon an input sequence $s_o=10, 00$ starting in state SR, the desired output sequence $d_o=00, 10$ will be generated. The I/O signature of $\sigma=\{(s_o, d_o)\}=\{(1,0,0,0); (0,0,1,0)\}$ is realized.

FIG. 7C illustrates a second implementation of a finite state machine to implement the same I/O signature or watermark, but using only a single added input and added state to state transition graph 700 in FIG. 7A without the addition of a new output. Therefore, implementation of state transition graph 740 in FIG. 7C is likely to be more efficient than implementation of state transition graph 720 in FIG. 7B, even though both will yield the same I/O signature. In the state transition graph 740. shown in FIG. 7C, the I/O signature is generated by a state transition from SR to S4 upon input configuration 10 (yielding output 0), from S4 to S2 upon input configuration 00 (yielding output 0), from S2 to SR upon input configuration 10 (yielding output 1), and from SR back to S2 upon input configuration 10 (yielding output 0). Therefore, the resulting output sequence is 0010, the same as with state transition graph 720 in FIG. 7B.

With a total of ten free input configurations by the addition of state S4 and a second input to state transition graph 700 in FIG. 7A, there are many choices available for generation of an I/O signature of 4-bit length. The element of randomness available in the I/O signature generation process can make detection of the watermark quite difficult.

Given many options typically available for generating an I/O signature in accordance with the above techniques, it is desirable to select those options that are the most efficient so that there is the least amount of additional overhead in terms of physical layout space or added timing considerations which may impact the user's design. Preferably, a path of state transitions is selected for the I/O signature which yields the smallest completely specified finite state machine upon implementation.

Figure 8A:
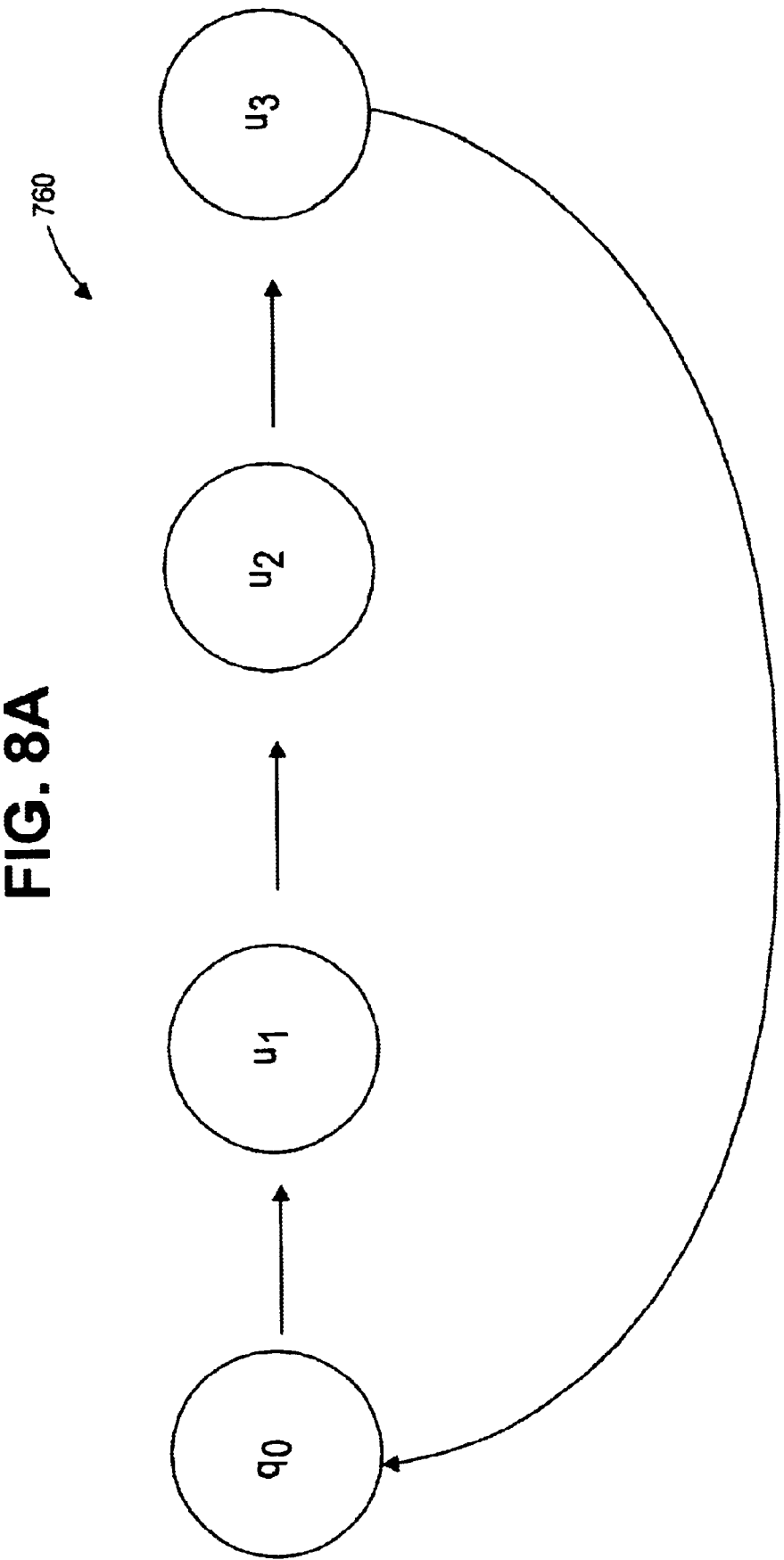
FIG. 8A is a state transition diagram for an incompletely specified finite state machine.

As an illustration of the use of an Euler path search for finding the optimum finite state machine implementation, a further example is illustrated in FIG. 8A, which depicts a state transition graph 760 with four states $q_o$, $u_1$, $u_2$ and $u_3$ for an incompletely specified finite state machine. Further, assume that three of the states (for example, $u_1$, $u_2$ and $u_3$) have free input configurations—that is, $u_1$, $u_2$, $u_3 \in U' \subset Q$. For each state, assume that there are three free input configurations out of a total of four possible input configurations.

Figure 8B:
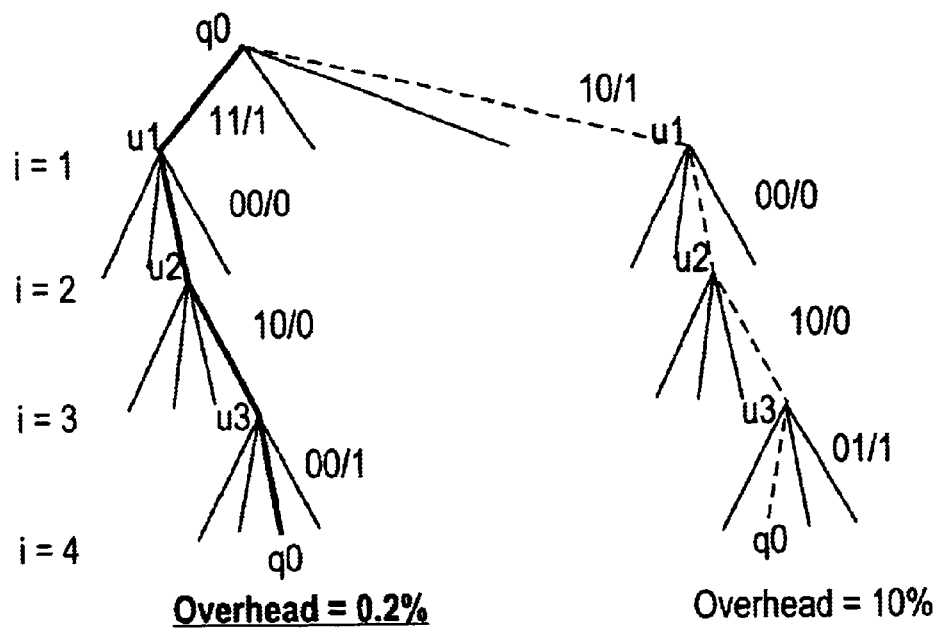
FIG. 8B is a diagram illustrating a decision tree that may be employed for selecting state transitions used in generating a watermark according to techniques as described herein.

A decision tree 780 such as illustrated in FIG. 8B may be used to derive the input sequence for an I/O signature. At each level i of the decision tree 780, exactly $|I_u^{(q')}| < |\Sigma|(=4$ in this case) branches exist. Each branch represents the decision of using a certain free input configuration at a given state. There exist $\Pi_{t=1}^{n}|I_u^{(q')}|$ possible paths connecting the root state $q_o$ to state $u'_{n-1}$. One or more of these paths is associated with the smallest implementation of a finite state machine. Finding the path associated with the smallest implementation of a finite state machine can be carried out in a number of ways. For example, techniques for logic optimization may be employed, such as those described in T. Villa, T. Kam, R. Brayton and A. Sanglovanni-Vincentelli, *Synthesis of Finite State Machines: Logic Optimization* (Kluwer Academic Publ., Boston, Mass., 1997), hereby incorporated by reference as if set forth fully herein. As an illustration, if the path shown in bold in FIG. 8B is used as the sequence of state transitions for generating the watermark, then the resulting I/O signature is as follows:

σ={(1,1,0,0,1,0,0,0); (1,0,0,1)}.

Generation of the specific input sequence such that overhead is minimized may be accomplished using a variety of techniques. According to one technique, for example, an exhaustive search of the decision tree is performed to select the optimum path. For each possible path, a final (i.e., completely specified) finite state machine is synthesized, and path resulting in the smallest finite state machine is selected.

Another technique for finding the optimum path may utilize a Monte Carlo approach or a variant thereof. With this approach, a set of input sequences (i.e., set of paths among the free input configurations) are selected at random from all the feasible ones. The number of paths selected for analysis depends in part on the number of free input configurations, the desired length of the I/O signature, and the desired level of confidence in achieving the optimal path. A final (i.e., completely specified) finite state machine corresponding to each such sequence is generated, and the path leading to the smallest one (preferably, in terms of size of required logic) is chosen.

Another possible technique for finding the optimum path is based on a branch-and-bound search. According to the branch-and-bound search technique, at each level of the decision tree an estimate is computed for the finite state machine associated with each sub-tree underlying any decision. Such an estimate may be computed, for example, using a Monte Carlo approach. According to one branch-and-bound search embodiment, all of the sub-trees with the highest estimates are pruned, while the surviving trees are explored into the next level, i.e. the next state of the evolving path $p_o$. The branch-and-bound search stops when it reaches the leaves of the decision tree.

The above techniques for selecting an optimal path for generating an I/O signature are not exhaustive but merely illustrative, and the invention herein is not limited to any particular means for path selection.

It is preferable that the I/O signature be generated with some degree of randomness so that using the same algorithm one will be less likely to generate an identical code. The randomized algorithm is preferably controlled by key k and is related to the algorithms used to minimize the finite state machine. The probability of accidentally synthesizing the same watermark is bounded by the degrees of freedom of the algorithm and/or by its level of randomization.

The process for performing passive watermarking is similar to that for active watermarking. However, passive watermarking is ordinarily limited to incompletely specified finite state machines, because completely specified finite state machines lack input sequences that are available to be matched with arbitrary output sequences to create the watermark.

In passive watermarking, an I/O signature is generated from a given incompletely specified finite state machine (ISFSM) Passive watermarking generally consists of converting the original incompletely specified finite state machine into a completely specified finite state machine using a set of given optimization criteria. Then, an I/O signature is selected at random from all the possible ones available.

Whether performing active watermarking, the I/O sequences designated for the watermark will generally increase the size of the finite state machine, and thus implementation overhead. On the other hand, passive watermarking will not impact overhead. It is preferred that a watermark increase the size of the finite state machine as little as possible while still performing its function of protecting the circuit design from illicit copying or use.

Once the I/O signature has been determined, then in step 510 of the process flow illustrated in FIG. 5, the circuitry supporting the I/O signature generation is added to the user's circuit design or the virtual circuit block, as the case may be. In a next step 511, the circuit design is implemented, and a net-list and physical layout (including placement and routing) are generated, whereby the finite state machine is realized.

Detection of the I/O signature or watermark σ from a circuit design in which the watermark has been embedded essentially entails applying the I/O signature input sequence $s_\sigma$ to the finite state machine and observing the output sequence. If no tampering has occurred, the resulting output sequence will match the expected output sequence; that is, no misses (i.e., unexpected output values) should occur.

The watermarking techniques described herein are likely to deter tampering with the embedded watermark because doing so is either detectable or causes a change in the functionality of the finite state machine. However, for these techniques of watermarking to be of maximum effectiveness, specifications on the state transition graph (STG) or state transition table (STT) should not be disclosed. If specifications on the STG or STT are known, the aggressor may be able to re-synthesize the finite state machine from the specifications.

Where the aggressor is not familiar with the state transition graph or table, then tampering will generally cause random modifications to the net-list or layout, which could in turn result in potentially extensive changes in the finite state machine's functionality. Such modifications could greatly impair the usefulness of the finite state machine. Therefore, aggressors will tend to be dissuaded from attempting to tamper with watermarked circuit designs or otherwise attempt to circumvent watermarking protection, since doing so will harm the circuit design.

If the I/O mapping of a completely specified finite state machine used in a circuit design is not known to an aggressor but the state transition graph or table is known to the aggressor, then the I/O mapping might be derived from the state transition graph or table. However, in most cases the computational and storage costs in doing so would be extremely high and therefore impractical. Thus, watermarking according to the foregoing techniques would be expected deter attempted infringement or circumvention even where the aggressor knows the state transition graph or table.

Nevertheless, where an aggressor knows the I/O mapping but not the state transition graph or table of a finite state machine, the aggressor may attempt to tamper with the finite state machine in two ways. First, the aggressor may modify state transition-relations, i.e. change the output or next state associated with a transition relation. Such a tampering may result in a change in the functionality of the finite state machine, rendering such tampering counter-productive. In such a case, the aforementioned techniques of watermarking would tend to deter the aggressor from tampering with the machine. Second, the aggressor may apply similar techniques to those described earlier herein to watermarking completely specified finite state machines. If the aggressor does so, however, tampering will only result in literal swaps and deletions within pairs of reset states, similar to gene deletion within DNA sequences. Accordingly, a genome search or similar search may be used to detect where in the I/O signature the corruption has occurred. A genome search generally works by locating and matching sections of the I/O signature that have not been tampered with to the original I/O signature a of the finite state machine. One type of genome search algorithm consists of selecting subsequences of the modified I/O signature that best match the original I/O signature a which includes the watermark. The matching criteria usually employed is the number of identical symbols. The length of the matching sections and the total number of identical figures in each section are used to compute the probability that the examined circuit design contains the original I/O signature a. Genome searching is described in more detail in E. Charbon, "Hierarchical Watermarking in IC Design," *Proc. IEEE Custom Integrated Circuit Conference*, (May 1998), at pp. 295–298, which article is hereby incorporated by reference as if set forth fully herein.

To detect when there has been a swaps and/or deletions in pairs of reset states, a cyclic redundancy check (CRC) may be used in connection with reading a generated output sequence. A cyclic redundancy check is a well-known technique for determining corruption of a data sequence. In a typical CRC check, the value of all the bytes in a data stream are added up to a test sum, and the result matched to the actual sum generated before corruption would have occurred. If the sums are identical, the sequence passes the CRC check and the data sequence is assumed, in the absence of other evidence, not to have been altered. Otherwise, the user may assume that the sequence has been altered, but may not know exactly where such alteration has occurred.

In a typical design cycle in which the use of virtual component blocks is envisioned, virtual component blocks may be designed for a number of technologies and applications by any of a number of different chip design firms. After development and design of virtual component blocks, the providers of virtual component blocks may sell to providers of electrical design automation and/or semiconductor vendors. The vendors purchase several IP's, possibly from various providers, which they then deliver to a foundry for assembly into a computer chip. After the foundry manufactures the computer chips made of the various IP's submitted by the vendor, the vendor sells the computer chips to consumers. In one embodiment as disclosed herein, a system is provided for allowing foundries to confirm that IP's or virtual circuit blocks appearing in circuit designs submitted for fabrication have been obtained from legitimate sources, using watermarking techniques.

Figure 9:
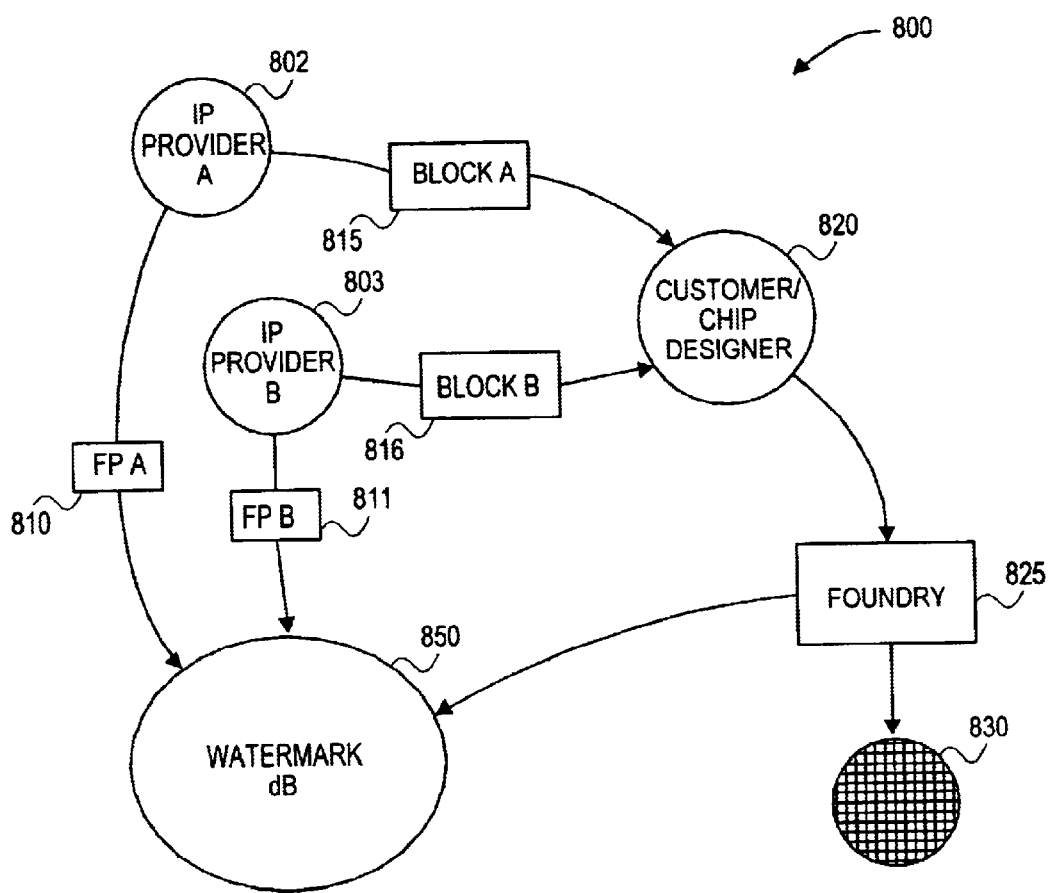
FIG. 9 is a diagram of a system including a watermark database for verifying that virtual circuit blocks used in circuit designs have been obtained legitimately.

FIG. 9 is a diagram of a watermark protection system 800 including a watermark database for verifying that virtual circuit blocks used in circuit designs have been obtained legitimately. As illustrated in FIG. 9, a first IP provider 802 generates a first virtual circuit block 815 having a first I/O signature 810, and a second IP provider 803 generates a second virtual circuit block 816 having a second I/O signature 811. While two IP providers 802 and 803 are shown in FIG. 9, it is contemplated that any number of IP providers may be involved in the watermarking protection system 800. IP providers 802, 803 provide the I/O signatures (also referred to as "fingerprints") 810, 811 for their respective virtual circuit blocks 815; 816 to a watermark or "fingerprint" database 850, where the I/O signatures 810, 811 are stored. Transferring the I/Q signatures 810, 811 to the watermark database 850 may be accomplished, for example, through any type of remote connection, such as by connecting over the Internet or by establishing a direct connection by modem or otherwise.

A customer or chip designer 820 desiring to create a circuit design using one or more virtual circuit blocks acquires the virtual circuit blocks 815 and 816 (in this example) from the IP providers 802, 803. The customer or chip designer 820 then incorporates the virtual circuit blocks 815 and 820 into a circuit design. When the customer or chip designer 820 has completed a circuit design to a point where it is ready for fabrication, the customer or chip designer 820 delivers the circuit design to a foundry 825. Before or after fabrication, the foundry 825 may use watermarking extraction tools for the purpose of extracting the I/O signatures 810, 811 from the circuit design to confirm that the virtual circuit blocks used therein were obtained legitimately. The foundry 825 runs known input sequences through the virtual circuit blocks 815, 816 which have become a part of the circuit design, and records the corresponding output sequences generated thereby. The foundry 825 may then access the watermark database 850 (which may be accomplished, for example, through any type of remote connection, such as by connecting over the Internet or by establishing a direct connection by modem or otherwise) to confirm that the extracted I/O signatures are registered with the watermark database 850. The foundry 825 may also rely on secondary information, such as suitable documentation from the customer or chip designer 820 that the virtual circuit blocks 815, 816 were acquired from a legitimate source.

Access to the watermark database 850 may be achieved by way of a database and/or application server (not shown) associated with the watermark database 850 for managing access requests and responding thereto. In one embodiment, for example, a user (such as foundry 825) connects to the watermark database 850 over a wide area or distributed electronic network (such as, e.g., the Internet), issues a query to a database or application server connected to the watermark database 850 (the query including the input signature and corresponding test output signature, or a set of test I/O signatures), and receives a message back from the database or application server over the wide area or distributed electronic network indicating whether the test output sequence exists in the watermark database 850.

Alternatively, a user (e.g., the foundry 825) may obtain information from the customer or chip designer 820 as to the source of the virtual circuit blocks 815, 820 used in the circuit design, and may specifically request I/O signatures from the watermark database 850 for the vendor products identified by the customer or chip designer 820. The user (e.g., foundry 825) may then apply the input sequence of the I/O signatures and confirm that the resulting test output sequences match the expected output sequences as indicated by the I/O signatures obtained from the watermark database 850.

Advantages that may be provided from the various embodiments as described herein include generation of a watermark that is transparent, robust and/or readily detectable. To optimize the transparency of the watermark, certain functionality is added to a circuit design to allow implantation of the watermark, while attempting to minimize implementation overhead for a given level of desired robustness.

If the state transition graph or table is not available for a finite state machine, watermarking according to the techniques disclosed herein is still possible. For example, it may be possible to identify portions of a finite state machine in a circuit design, and these identifiable portions of the finite state machine may be augmented or otherwise adapted to carry an I/O signature as described hereinbefore. Watermarking of identifiable portions of the finite state machine may be done so long as those portions are both controllable and observable.

Various of the disclosed methods of watermarking herein may be performed simultaneously at various levels of abstraction, and to facilitate tracking and identification of the aggressor party. The disclosed methods and related systems, in one aspect, provide a mechanism for a user purchasing or otherwise acquiring a netlist or other design from a provider to create a custom virtual circuit block, and in the process insert the new owner's unique watermark at one or more design levels so as to protect the modified/customized design.

In another aspect of various embodiments disclosed herein, watermarking may be performed at either or both of the compiler level and the physical design level. Watermarking at the compiler level is possible because hidden functionality can be added at that level. At the physical design level, area minimization takes place which allows implantation of a watermark there also.

Both active and passive watermarking according to the presently disclosed methods and related systems are robust, because the deletion of the watermark will typically result in removing the desired functionality of the circuit design. Moreover, watermarking may also allow forgery and similar misuse to be traced to the source, assuming watermarks at the compiler level are associated with different licenses than the watermarks at the physical design level.

An advantage of the watermarking techniques described herein with regard to watermark detection is that it is not generally necessary to examine the physical layout of the circuit design or the net-list or other circuit design software in order to detect the watermark. Detection of the watermark may be accomplished by applying the appropriate input sequence, and examining the corresponding output sequence, which is simpler and easier than doing a detailed examination of the physical layout or the circuit design software, and less prone to tampering.

Although various embodiments have sometimes been described herein in terms of deterministic finite state machines, the disclosed concepts of watermarking are also applicable to other sequential functions including, for example, non-deterministic finite state machines.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A method for embedding an input/output signature into a circuit design, said circuit design comprising a finite state machine, said method comprising the steps of:

finding a set of free input configurations for the finite state machine, each free input configuration being without a specified output or destination state;

selecting a path from among the set of free input configurations, said path comprising a series of state transitions; and assigning output values to each state transitions, said output values collectively comprising an output signature.

2. The method of claim 1, further comprising the step of determining whether said finite state machine is completely specified or incomplete specified, and if said finite state machine is completely specified, transforming said finite state machine into an incompletely specified finite state machine.

3. The method of claim 2, further comprising the step of adding at least one of an additional input, an additional output or an additional state to said finite state machine if it is completely specified.

4. The method of claim 1, wherein said step of selecting said path from among the set of free input configurations comprises the step of searching a decision tree for an optimal path, said decision tree comprising an initial state at its root and subsequent states as its leaves.

5. The method of claim 1, wherein said step of selecting said path from among the set of free input configurations comprises the step of using a Monte Carlo analysis to select the free input configurations for said path.

6. The method of claim 5, wherein said step of selecting said path from among the set of free input configurations comprises the steps of randomly selecting a set of input sequences from all feasible input sequences, generating a plurality of completely specified finite state machines, each such completely specified finite state machine corresponding to one of said randomly selected input sequences, and selecting a path associated with the smallest of said completely specified finite state machines.

7. The method of claim 1, wherein said step of selecting said path from among the set of free input configurations comprises the steps of applying a branch-and-bound search whereby, at each level of a decision tree, an estimate is computed for a finite state machine associated with each sub-tree underlying any decision of the decision tree, pruning the sub-trees with the highest estimates, and analyzing the surviving sub-trees into the next level, in a repeating sequence until a complete path is specified.

8. The method of claim 1, further comprising the step of designating an input sequence for said path, said input sequence corresponding to a sequence of input values associated with said series of state transitions and collectively comprising an input signature.

9. The method of claim 8, further comprising the step of laying out said finite state machine in a physical circuit design.

10. The method of claim 9, further comprising the step of applying said input sequence to a portion of said physical circuit design corresponding to said finite state machine, and detecting a test output sequence therefrom.

11. The method of claim 10, further comprising the step of comparing said test output sequence to said output signature.

12. The method of claim 11, further comprising the step of obtaining said output signature from a database of I/C signatures.

13. The method of claim 12, wherein said step of obtaining said output signature from said database of I/O signatures comprises the step of connecting said database over a wide area network, issuing a query to an application server connected to said database, and receiving a message from said application server over said wide area network, said message comprising an indication of whether said test output sequence exists in said database of I/O signatures.

14. A method for watermarking a circuit design, said circuit design comprising at least one internal sequential function, said method comprising the steps of:
identifying free input configurations in an internal sequential function of the circuit design, each free input configuration being without a specified output or destination state; and
modifying said internal sequential function of the circuit design to generate a predictable output sequence when a specified input sequence is applied, by using said free input configurations.

15. The method of claim 14, wherein said circuit design is functionally complete prior to said step of identifying free input configurations and said step of modifying said internal sequential function of the circuit design.

16. The method of claim 14, wherein said output sequence is unrelated to the functionality of the circuit design.

17. The method of claim 14, further comprising the step of
summing said free input configurations,
testing the sum of said free input configurations against at least one watermarking robustness criterion, and
adding additional free input configurations if said at least one watermarking robustness criterion is not met.

18. The method of claim 17, wherein said internal sequential function is embodied in a finite state machine, and wherein said step of adding additional free input configurations comprises the step of
adding an input, an output or an additional state to said finite state machine.

19. The method of claim 18, further comprising the step of
selecting an output sequence according in part to a random key.

20. The method of claim 18, wherein said step of modifying said internal sequential function of the circuit design comprises the step of
selecting a path among said free input configurations,
assigning output values to state transitions along said path to define said predictable output sequence.

21. The method of claim 20, wherein input values along said path among said free input configurations collectively define said specified input sequence.

22. The method of claim 20, wherein said step of selecting said path among said free input configurations comprises the step of
searching a decision tree for an optimal path, said decision tree comprising an initial state at its root and subsequent states at its leaves.

23. The method of claim 20, wherein said step of selecting said path among said free input configurations comprises the step of
using a Monte Carlo analysis to select the free input configurations for said path.

24. The method of claim 20, wherein said step of selecting said path among said free input configurations comprises the steps of
randomly selecting a set of input sequences from all feasible input sequences,
generating a plurality of completely specified finite state machines, each such completely specified finite state machine corresponding to one of said randomly selected input sequences, and
selecting a path associated with the smallest of said completely specified finite state machines.

25. The method of claim 20, wherein said step of selecting said path from among said free input configurations comprises the steps of
applying a branch-and-bound search whereby, at each level of a decision tree, an estimate is computed for a finite state machine associated with each sub-tree underlying any decision of the decision tree,
pruning the sub-trees with the highest estimates, and
analyzing the surviving sub-trees into the next level, in a repeating sequence until a complete path is specified.

26. The method of claim 14, further comprising the step of
applying said specified input sequence to said circuit design, and observing a test output sequence of said circuit design.

27. A method for synthesizing a watermark for a circuit design, said circuit design comprising a finite state machine, said method comprising the steps of:
determining whether said finite state machine is completely specified or incompletely specified;
if said finite state machine is completely specified, transforming said finite state machine into an incompletely specified finite state machine by augmenting said finite state machine by the addition of one or more inputs, outputs or internal states;
identifying free input configurations in said finite state machine; and
selecting a path among said free input configurations such that a specified output sequence is generated upon application of a known input sequence.

28. A method for synthesizing a watermark for a circuit design, said circuit design comprising a finite state machine, said method comprising the steps of:

determining whether said finite state machine is completely specified or incompletely specified;

if said finite state machine is completely specified, transforming said finite state machine into an incompletely specified finite state machine by augmenting said finite state machine by the addition of one or more inputs, outputs or internal states;

identifying free input configurations in said finite state machine; and selecting a path among said free input configurations such that a specified output sequence is generated upon application of a known input sequence.

29. The method of claim 28, further comprising the steps of:

testing characteristics of said finite state machine against at least one watermarking criterion prior to selecting said path among said free input configurations; and if said at least one watermarking criterion is not met, augmenting said finite state machine by the addition of one more inputs, outputs or internal states.

30. The method of claim 29, further comprising the step of selecting said specified output sequence using a random key.

31. The method of claim 28, wherein said step of selecting said path among said free input configurations comprises the step of searching a decision tree for an optimal path, said decision tree comprising an initial state at its root and subsequent states at its leaves.

32. The method of claim 31, wherein said initial state and said subsequent states connected by a plurality of state transitions defined by all possible input configurations.

33. The method of claim 28, wherein said step of selecting said path among said free input configurations comprises the step of using a Monte Carlo analysis to select the free input configurations for said path.

34. The method of claim 28, wherein said step of selecting said path among said free input configurations comprises the steps of randomly selecting a set of input sequences from all feasible input sequences, generating a plurality of completely specified finite state machines, each such completely specified finite state machine corresponding to one of said randomly selected input sequences, and selecting a path associated with the smallest of said completely specified finite state machines.

35. The method of claim 28, wherein said step of selecting said path from among said free input configurations comprises the steps of applying a branch-and-bound search whereby, at each level of a decision tree, an estimate is computed for a finite state machine associated with each sub-tree underlying any decision of the decision tree, pruning the sub-trees with the highest estimates, and analyzing the surviving sub-trees into the next level, in a repeating sequence until a complete path is specified.

36. The method of claim 28, further comprising the step of applying said known input sequence to said circuit design, and observing a test output sequence from said circuit design.

37. The method of claim 36, further comprising the step of comparing said test output sequence to said specified output sequence.

38. A method for embedding an input/output signature into a circuit design, said circuit design comprising a finite state machine, said method comprising:

determining a minimum number of free input configurations for the finite state machine, each free input configuration being without a specified output or destination state;

selecting the minimum number of free input configurations from a set of free input configurations;

selecting a path from among the selected free input configurations, said path comprising a series of state transitions; and assigning output values to each state transitions, said output values collectively comprising an output signature.

39. The method of claim 38, wherein selecting the minimum number of free input configurations from the set of free input configurations further comprises:

selecting free input configurations from the set that satisfy a given probability that the I/O signature is unique.

40. The method of claim 38, wherein selecting the minimum number of free input configurations from the set of free input configurations further comprises:

determining that the minimum number of free input configurations is greater than the number of free input configurations in the set; and increasing the number of free input configurations in the set.

* * * * *

UNITED STATES PATENT AND TRADEMARK OFFICE
CERTIFICATE OF CORRECTION

PATENT NO.    : 6,625,780 B1
DATED         : September 23, 2003
INVENTOR(S)   : Edoardo Charbon and Ilhami H. Torunoglu It is certified that error appears in the above-identified patent and that said Letters Patent is hereby corrected as shown below:

Title page,
Item [56], References Cited, OTHER PUBLICATIONS, please replace "samll" with -- small --; please replace "optimazation" with -- optimization --; and please replace "state reduction of completely specified FSM's" with -- State Reduction in Incompletely Specified Finite State Machines" --.

Column 22,
Lines 50-64, please replace:
"27. A method for synthesizing a watermark for a circuit design, said circuit design comprising a finite state machine, said method comprising the steps of:
determining whether said finite state machine is completely specified or incompletely specified; if said finite state machine is completely specified, transforming said finite state machine into an incompletely specified finite state machine by augmenting said finite state machine by the addition of one or more inputs, outputs or internal states;
identifying free input configurations in said finite state machine; and
selecting a path among said free input configurations such that a specified output sequence is generated upon application of a known input sequence." with
-- 27. The method of claim 26, further comprising the step of
comparing said test output sequence to said predictable output sequence. --.

Column 23,
Line 21, please replace "one more inputs" with -- one or more inputs --.
Line 34, please replace "subsequent states connected by" with -- subsequent states are connected by --.

Signed and Sealed this

Twentieth Day of January, 2004

JON W. DUDAS
*Acting Director of the United States Patent and Trademark Office*